(12) United States Patent
Wahl et al.

(10) Patent No.: US 8,963,255 B2
(45) Date of Patent: Feb. 24, 2015

(54) STRAINED SILICON CARBIDE CHANNEL FOR ELECTRON MOBILITY OF NMOS

(71) Applicant: GLOBALFOUNDRIES Inc., Grand Cayman, KY (US)

(72) Inventors: Jeremy A. Wahl, Delmar, NY (US); Kingsuk Maitra, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/219,910

(22) Filed: Mar. 19, 2014

(65) Prior Publication Data

US 2014/0203298 A1    Jul. 24, 2014

Related U.S. Application Data

(62) Division of application No. 12/726,904, filed on Mar. 18, 2010, now Pat. No. 8,722,482.

(51) Int. Cl.
*H01L 29/76* (2006.01)
*H01L 29/94* (2006.01)

(52) U.S. Cl.
USPC ............................ 257/369; 257/371; 257/374

(58) Field of Classification Search
USPC ................... 257/69, 369, 371, 374, E21.633, 257/E29.104
See application file for complete search history.

(56) References Cited

U.S. PATENT DOCUMENTS

| 7,005,333 | B2* | 2/2006 | Li .................................. 438/172 |
| 7,399,663 | B2* | 7/2008 | Hoentschel et al. .......... 438/151 |
| 8,110,487 | B2* | 2/2012 | Griebenow et al. ........... 438/517 |
| 2006/0046399 | A1 | 3/2006 | Lindert et al. |
| 2011/0227094 | A1 | 9/2011 | Wahl et al. |

OTHER PUBLICATIONS

Fukutome, H. et al. "(110) NMOSFET's Competitive to (001) NMOSFET's: Si Migration to Create (331) Facet and Ultra-Shallow Al Implantation after NiSi Formation", IEEE retrieved on Feb. 28, 2010, 4 pages.
Harris, H.R. et al. "Flexible, Simplified CMOS on Si (110) with Metal Gate/ High k for HP and LSTP", IEEE 2007, pp. 57-60.
Packan, P. et al. High Performance Hi-K+ Metal Gate Strain Enhanced Transistors on (110) Silicon, IEEE 2008, pp. 63-66.

* cited by examiner

*Primary Examiner* — Hung Vu
(74) *Attorney, Agent, or Firm* — Ditthavong & Steiner, P.C.

(57) ABSTRACT

A semiconductor is formed on a (110) silicon (Si) substrate, with improved electron mobility. Embodiments include semiconductor devices having a silicon carbide (SiC) portion in the nFET channel region. An embodiment includes forming an nFET channel region and a pFET channel region in a Si substrate, such as a (110) Si substrate, and forming a silicon carbide (SiC) portion on the nFET channel region. The SiC portion may be formed by ion implantation of C followed by a recrystallization anneal or by epitaxial growth of SiC in a recess formed in the substrate. The use of SiC in the nFET channel region improves electron mobility without introducing topographical differences between NMOS and PMOS transistors.

17 Claims, 3 Drawing Sheets

STRAINED SILICON CARBIDE CHANNEL FOR ELECTRON MOBILITY OF NMOS

CROSSED-REFERENCED APPLICATION

This application is a division of U.S. application Ser. No. 12/726,904 filed Mar. 18, 2010, the entirety of which is incorporated herein by reference.

TECHNICAL FIELD

The present disclosure relates to CMOS semiconductor devices with improved electron mobility. The present disclosure is particularly applicable to semiconductors with (110) silicon substrates.

BACKGROUND

As reductions in device scaling continue channel mobility issues become more problematic, particularly for NMOS transistors. It has been found that (110) silicon (Si) boosts hole mobility, thereby improving PMOS performance over (100) Si. However, electron mobility on (110) Si degrades by a comparable amount to the PMOS boost. Stress liners and embedded stressors may be used to improve electron mobility. However, as CMOS scaling reaches smaller and smaller pitches, such as 22 nanometer (nm) node and beyond, the smaller pitch between gates significantly reduces stressor volume, and, therefore, stressor benefit. Therefore, at smaller pitches, the benefit of stress liners and embedded stressors does not overcome the large mobility penalty in the (110) Si substrate.

A need therefore exists for methodology enabling the formation of a CMOS device with both increased hole mobility for the PMOS device and increased electron mobility for the NMOS device.

SUMMARY

An aspect of the present disclosure is an improved method of fabricating a semiconductor exhibiting improved electron mobility on a Si substrate, particularly a (110) Si substrate.

Another aspect of the present disclosure is a semiconductor exhibiting improved electron mobility on a Si substrate, particularly a (110) Si substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method comprising: forming an nFET channel region and a pFET channel region in a silicon (Si) substrate; and forming a silicon carbide (SiC) portion on the nFET channel region.

Aspects of the present disclosure include forming the nFET channel region and the pFET channel region in a (110) Si substrate. Further aspects include forming the SiC portion by implanting carbon (C) into the nFET channel region. Additional aspects include forming a photoresist over the pFET channel region prior to implanting the C; removing the photoresist after implanting the C; and recrystallization annealing the C-doped Si. Another aspect includes implanting monomer C. Other aspects include implanting cluster C, such as $C_7H_7$ or $C_{16}H_{10}$. Further aspects include implanting C at a temperature of about 25° C. or less, for example at a temperature of about −40° C. to about −100° C. ("cold"). Additional aspects include forming the SiC portion by epitaxially growing SiC on the nFET channel region. Other aspects include forming an oxide on the pFET channel region prior to growing the SiC; and removing the oxide after growing the SiC. Another aspect includes forming a recess in the nFET region of the substrate after forming the oxide; and growing the SiC in the recess. Further aspects include forming the oxide at a thickness of about 50 Å to about 200 Å.

Another aspect of the present disclosure is a semiconductor device comprising: a silicon (Si) substrate; an nFET channel region and a pFET channel region in the substrate; and strained silicon carbide (SiC) on the nFET channel region.

Aspects include a semiconductor device wherein the substrate comprises (110) Si. Further aspects include the strained SiC being formed in a recess in the substrate. Another aspect includes the SiC thickness being about 5 nm to about 15 nm. Additional aspects include the concentration of carbon (C) in the SiC being about 0.25% to about 2%. Other aspects include an nFET formed on the SiC and a pFET formed on the pFET channel region of the substrate with a shallow trench isolation (STI) region there between.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the electron mobility problem attendant upon forming a CMOS, particularly on a (110) Si substrate. In accordance with embodiments of the present disclosure, SiC is formed in the nFET channel region of the substrate prior to forming a CMOS on the substrate. Consequently, electron mobility for the NMOS is improved. Therefore, enhanced PMOS performance from use of a (110) Si substrate can be realized with no corresponding degradation of NMOS performance.

Methodology in accordance with embodiments of the present disclosure includes forming an nFET channel region and a pFET channel region in a silicon (Si) substrate, and forming a silicon carbide (SiC) portion on the nFET channel region.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
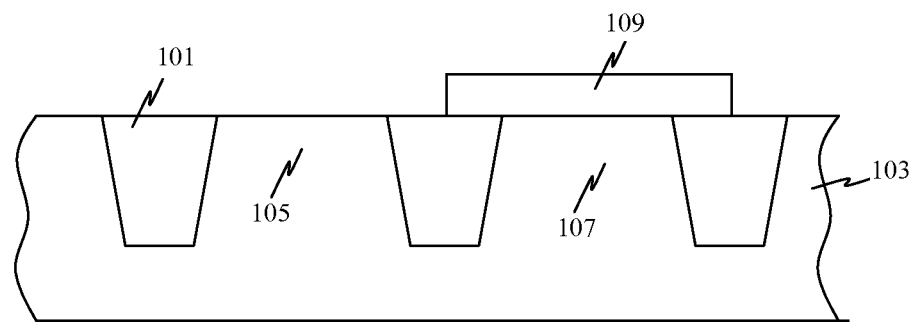
FIGS. 1A through 1C schematically illustrates sequential steps of a method in accordance with an exemplary embodiment.
Figure 1B:
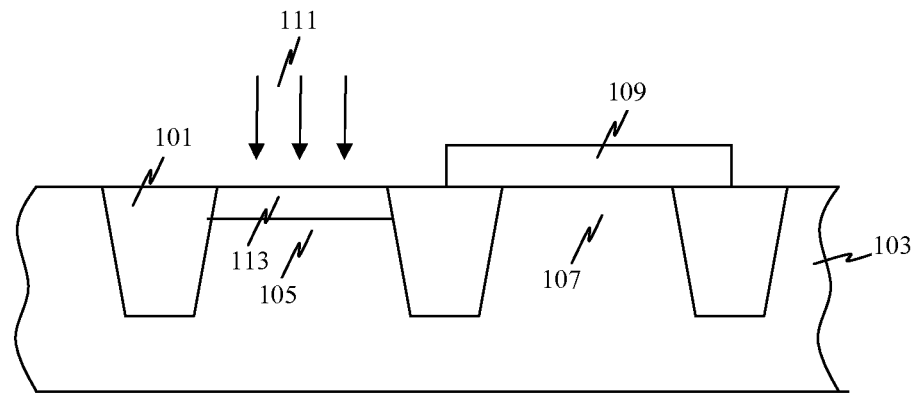
Figure 1C:
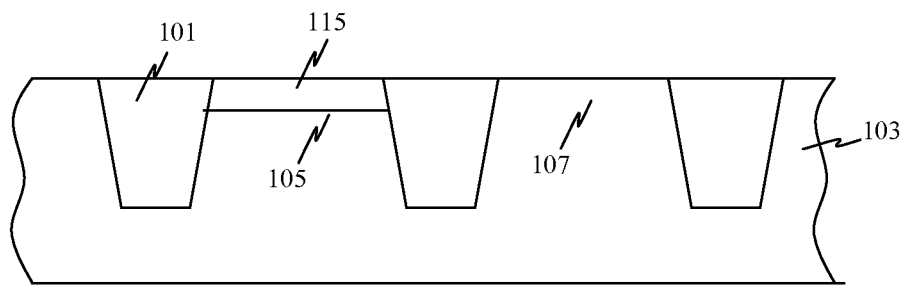

A process for fabricating a semiconductor device in accordance with an embodiment of the present disclosure is illustrated in FIGS. 1A through 1C. Adverting to FIG. 1A, STI regions 101 are formed in a (110) Si substrate 103, by a conventional method, separating nFET channel region 105 from pFET channel region 107. pFET channel region 107 is then masked by forming photoresist 109 thereover. The photoresist may, for example, be a block mask, as is typically employed for masking source/drain regions, extension regions, etc. The photoresist is formed at a sufficient thickness to prevent C implantation into the pFET region, for example a thickness of greater than or equal to about 50 nanometer (nm).

As illustrated in FIG. 1B, nFET region 105 is then ion implanted with C, shown as 111, to form carbon doped region 113. The implant may be monomer C or cluster C, e.g., C7H7 or C16H10. The implantation is performed at room temperature (25° C.) or lower, for example at a temperature between about −40° C. and about −100° C. The dose and energy are determined by the desired C concentration and depth depending on the particular device feature size and function. For example, carbon may be implanted at a dose of about 1E14 $cm^{-2}$ to about 1E16 $cm^{-2}$, e.g., about 1E15 $cm^{-2}$, and at an energy of about 3 keV (for monomer C), and the depth of region 113 may reach about 5 nm to about 15 nm, e.g., about 10 nm.

After the desired C concentration and depth are obtained, photoresist 109 is removed and the C-doped Si is recrystallized by a recrystallization anneal, resulting in SiC portion 115, as illustrated in FIG. 1C. The anneal may be, for example, solid phase epitaxial regrowth (SPER) via furnace annealing, spike rapid thermal annealing (sRTA), or millisecond annealing (MSA), such as laser annealing or flash annealing. The annealing conditions are designed to induce strain due to lattice mismatch between the SiC and Si. For example, SPER may occur at about 500° C. to about 750° C. for about 1 minute to about an hour, e.g., at about 500° C. for about an hour or at about 650° C. for about 10 minutes. sRTA, on the other hand, may be performed at about 750° C. to about 1150° C. for essentially no time (i.e., a spike). MSA may take place at about 1150° C. to about 1350° C. for about 250 microseconds to about 10 milliseconds. Processing then continues (not shown) with gate patterning, spacer formation, source/drain formation, silicidation, etc., to form an NMOS transistor on SiC portion 115 and a PMOS on substrate 103 at pFET channel region 107.

Adverting to FIGS. 2A through 2E, a process for fabricating a semiconductor device in accordance with another embodiment of the present disclosure is illustrated. STI regions 201 are formed in a (110) Si substrate 203, by a conventional method, separating nFET channel region 205 from pFET channel region 207. A thin oxide layer 209 is deposited over substrate 203 and STI regions 201. The oxide layer 209 is deposited at a thickness sufficient to protect the pFET channel region during epitaxial growth, as at a thickness of about 50 Å to about 200 Å. Next, pFET channel region 207 is masked by forming a photoresist 211 on oxide layer 209 over pFET channel region 207. Photoresist 211 is formed, for example, at a thickness of about 50 nm to about 500 nm.

Figure 2A:
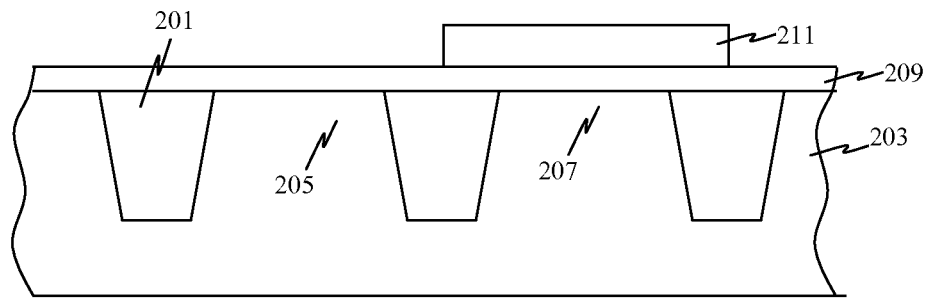
FIGS. 2A through 2E schematically illustrate sequential steps of a method in accordance with another exemplary embodiment.
Figure 2B:
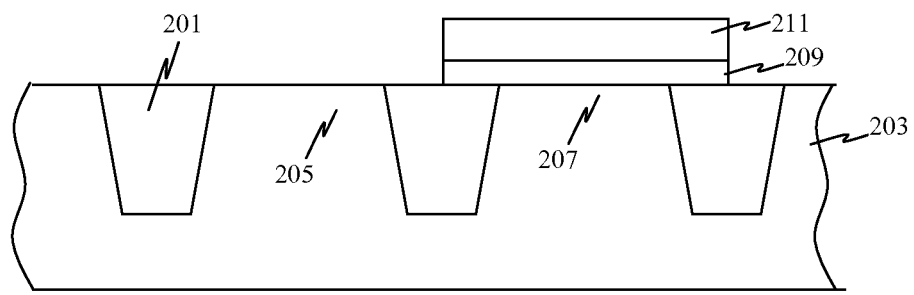

As illustrated in FIG. 2B, oxide layer 209 is removed from nFET channel region 205. Wet etching, for example with hydrofluoric (HF) acid, or dry etching, e.g., with a plasma etch, may be employed to remove oxide layer 209.

Figure 2C:
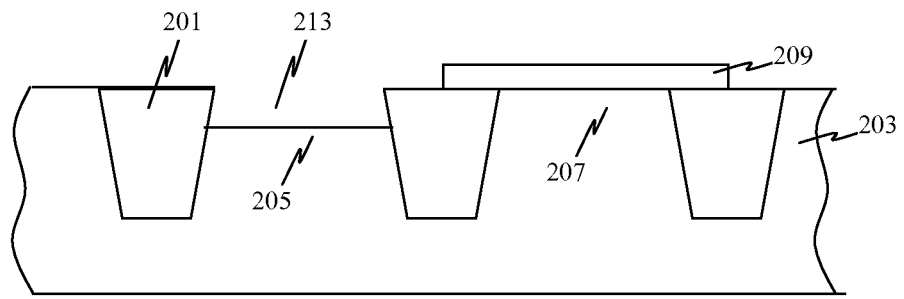

Photoresist 211 is then removed, as shown in FIG. 2C. A recess 213 may be formed in substrate 203 in nFET channel region 205, for example by in situ hydrochloric (HCl) etching. Recess 213 is formed to a depth of about 5 nm to about 15 nm, e.g., about 10 nm.

Figure 2D:
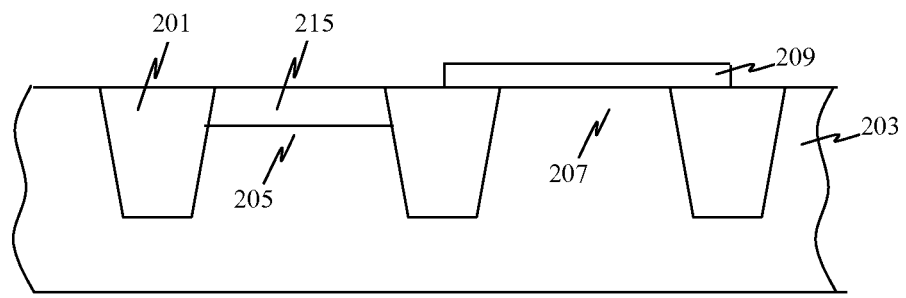
Figure 2E:
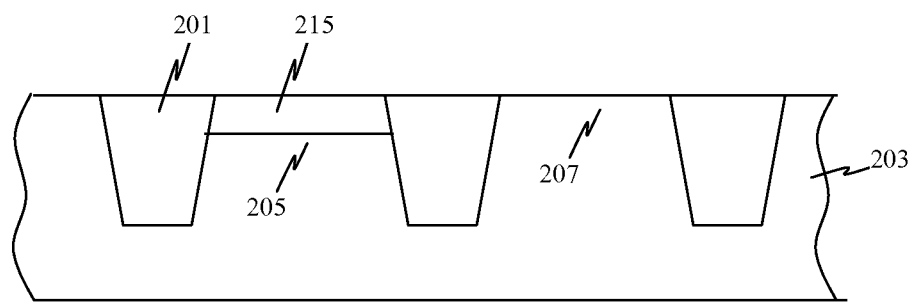

Adverting to FIG. 2D, SiC is epitaxially grown in recess 213 to form strained SiC portion 215. Alternatively, SiC may be epitaxially grown directly on substrate 203, with no recess. However, epitaxially growing SiC directly on substrate 203 introduces undesirable topographical differences between the later formed NMOS and PMOS. Epitaxial growth may be performed, for example, with silane, dichlorosilane, monomethylsilane, dimethylsilane, at a temperature of about 700° C. to about 800° C., for about 30 min to about 60 min. The C concentration in strained SiC portion 215 may range from about 0.25% to about 2%.

After the strained SiC portion is complete, oxide layer 209 is removed, as by wet etching using hydrofluoric acid (HF) or by dry etching using CF4, CHF3 and other commonly used oxide etching gases. The substrate is then ready for further conventional processing, such as gate patterning, spacer formation, source/drain formation, silicidation, etc. (not shown), to form an NMOS transistor on SiC portion 215 and a PMOS on substrate 203 at pFET channel region 207.

The embodiments of the present disclosure can achieve several technical effects, including increased hole mobility for improved PMOS performance with no corresponding degradation in electron mobility, thereby improving NMOS performance. The present disclosure enjoys industrial applicability in any of various types of highly integrated semiconductor devices particularly 22 nanometer (nm) node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A semiconductor device comprising:
a silicon (Si) substrate;
an nFET channel region and a pFET channel region in the substrate;

strained silicon carbide (SiC) formed in an upper portion of the nFET channel region at an upper surface thereof and not in the pFET channel region; and an nFET gate over the nFET channel region and a pFET gate over the pFET channel region and source/drain regions at opposite sides of each of the nFET and pFET gates.

2. The semiconductor device according to claim 1, wherein the substrate comprises (110) Si.

3. The semiconductor device according to claim 1, wherein the SiC has a thickness of about 5 nanometers (nm) to about 15 nm.

4. The semiconductor device according to claim 1, wherein a concentration of carbon (C) in the SiC is about 0.25% to about 2%.

5. The semiconductor device according to claim 1, further comprising a shallow trench isolation (STI) region between the pFET and the nFET gates.

6. The semiconductor device according to claim 1, wherein the SiC is formed by implanting carbon (C) into the nFET channel region followed by annealing.

7. The semiconductor device according to claim 6, wherein the C is implanted at a temperature of 25° C. or lower.

8. A semiconductor device comprising:
a silicon (Si) substrate;
an nFET channel region and a pFET channel region, separated from the nFET channel region, in the substrate;
strained silicon carbide (SiC) formed to a depth of about 5 nanometers (nm) to about 15 nm in the nFET channel region and not in the pFET channel region;
an nFET gate over the nFET channel region and a pFET gate over the pFET channel region; and
FET source/drain regions at opposite sides of each of the nFET and pFET gates.

9. The semiconductor device according to claim 8, wherein the silicon substrate comprises (110) Si.

10. The semiconductor device according to claim 8, wherein a concentration of carbon (C) in the SiC is about 0.25% to about 2%.

11. The semiconductor device according to claim 8, further comprising a shallow trench isolation (STI) region separating the nFET and pFET channel regions.

12. The semiconductor device according to claim 8, wherein the SiC is formed by implanting carbon (C) into the nFET channel region followed by annealing.

13. The semiconductor device according to claim 12, wherein the C is implanted at a temperature of 25° C. or lower.

14. A semiconductor device comprising:
a (110) silicon (Si) substrate;
an nFET channel region and a pFET channel region in the substrate, the pFET channel region separated from the nFET channel region by a shallow trench isolation (STI) region, wherein the nFET channel region, but not the pFET channel region, comprises:
a first portion of strained silicon carbide (SiC) formed to a depth of about 5 nanometers (nm) to about 15 nm at an upper surface of the (110) Si substrate, and
a second portion, below the first portion;
an nFET gate over the first nFET channel region and a pFET gate over the pFET channel region; and
FET source/drain regions at opposite sides of each of the nFET and pFET gates.

15. The semiconductor device according to claim 14, wherein a concentration of carbon (C) in the SiC is about 0.25% to about 2%.

16. The semiconductor device according to claim 14, wherein the SiC is formed by implanting carbon (C) into the first nFET channel region followed by annealing.

17. The semiconductor device according to claim 16, wherein the C is implanted at a temperature of 25° C. or lower.

* * * * *